US006769921B1

(12) United States Patent
Broder et al.

(10) Patent No.: US 6,769,921 B1
(45) Date of Patent: *Aug. 3, 2004

(54) PRINTED CIRCUIT BOARD ELECTROMAGNETIC ENERGY DEVICE

(75) Inventors: Damon W. Broder, Austin, TX (US); Orin M. Ozias, Ceder Park, TX (US)

(73) Assignee: Dell USA L.P., Round Rock, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 498 days.

(21) Appl. No.: 09/419,157

(22) Filed: Oct. 15, 1999

(51) Int. Cl.[7] .............................................. H01R 12/00
(52) U.S. Cl. ...................................................... 439/74
(58) Field of Search ........................ 439/74, 535, 76.1, 439/636, 637

(56) References Cited

U.S. PATENT DOCUMENTS

| | | | |
|---|---|---|---|
| 5,225,629 A | | 7/1993 | Garrett ...................... 174/35 R |
| 5,532,428 A | | 7/1996 | Radloff et al. ......... 174/35 GC |
| 5,555,158 A | * | 9/1996 | Dent .......................... 361/684 |
| 5,647,748 A | | 7/1997 | Mills et al. ................... 439/81 |
| 5,703,760 A | * | 12/1997 | Zhu ............................ 361/785 |
| 5,729,183 A | * | 3/1998 | Schuchmann et al. ......... 333/1 |
| 5,975,920 A | * | 11/1999 | Oberstarr ...................... 439/83 |
| 5,987,553 A | * | 11/1999 | Swamy et al. .............. 710/129 |
| 6,046,410 A | * | 4/2000 | Wojnarowski et al. ...... 174/262 |
| 6,046,912 A | * | 4/2000 | Leman ........................ 361/784 |
| 6,129,556 A | * | 10/2000 | Sihn et al. .................... 439/61 |

OTHER PUBLICATIONS

Richard S. Mills and David L. Moss, U.S. patent application entitled, "Removable TEM Shield for Daughter Card and Associated Methods of Manufacturing"; Ser. No. 08/503,577, filed Jul. 18, 1995 (copy not enclosed).

Intel, *Mobile Audio/Modem Daughter Card Specification*, Revision 1.0, Feb. 22, 1999.

* cited by examiner

Primary Examiner—Ross Gushi
(74) Attorney, Agent, or Firm—Hamilton & Terrile, LLP; Robert W. Holland (57) ABSTRACT

A computer system including at least one microprocessor mounted on a printed circuit board, and at least two electrical connectors proximate to the printed circuit board, with the at least two electrical connectors spaced to attenuate at least one prespecified frequency electromagnetic energy waveform.

82 Claims, 6 Drawing Sheets

PRINTED CIRCUIT BOARD ELECTROMAGNETIC ENERGY DEVICE

BACKGROUND

1. Technical Field

This patent application relates, in general, to suppressing electromagnetic radiation in and around printed circuit boards.

2. Description of the Related Art

Printed circuit boards used in various types of data processing systems (e.g., computers) are typically mounted within a plastic or sheet metal housing structure. During operation of a printed circuit board electromagnetic radiation is generated.

Electromagnetic radiation can interfere with data processing system operation. Accordingly, efforts are made within the art to shield printed circuit boards and printed circuit board components from electromagnetic radiation. Conventionally, such shielding is accomplished via a sheet metal housing (often referred to in the art as a "can" or "fence") used to enclose a printed circuit board. The sheet metal housing is normally grounded directly to a ground plane in the printed circuit board.

Printed circuit boards are conventionally referred to as motherboards and daughterboards. A motherboard is the main circuit board containing the primary components of a computer system. A daughterboard is a circuit board that attaches to a motherboard, or other type board, and provide additional or enhanced functions to a motherboard.

A daughterboard is typically connected to a motherboard via a card edge connector, the socket portion of which is conductively mounted on the motherboard, and the pin portion of which is an edge of the daughterboard with conductive traces thereon. Conventionally, the motherboard is generally horizontally disposed in the bottom portion of the housing structure, and the daughterboard is generally vertically disposed, being connected at its bottom edge to the card edge connector on the top surface of the motherboard. Daughterboards are also typically shielded with metal fences, or cans, in a fashion analogous to that described for motherboards.

Recent advances in the art have resulted in a movement toward smaller and smaller enclosures for the printed circuit boards used in data processing systems. Accordingly, it is becoming common for daughterboards to be oriented parallel with the motherboard, so that the necessary height requirement for the system is decreased. However, even with the daughterboards so oriented, the conventional method of shielding the mother and daughterboards and their attendant components continues to be a can, or fence, enclosing the area to be shielded.

Such a manner of shielding is disadvantageous for several reasons. For example, it is difficult to orient and correctly place the fence during board fabrication. The presence of the fence also creates a heat dissipation problem. In addition, the presence of the can requires the use of secondary parts and equipment above and beyond that normally necessary to fabricate printed circuit boards. Furthermore, use of the fence or can is generally fairly inflexible in that ordinarily it is used to enclose the entire board surface to be shielded.

From the foregoing, it is therefore apparent that a need exists in the art for a device which provides shielding of printed circuit boards from electromagnetic radiation in a way that overcomes or alleviates the foregoing noted disadvantages.

SUMMARY

A device and a method of manufacturing the device have been discovered which provide shielding of printed circuit boards and printed circuit board components such that entire printed circuit boards and/or individual printed circuit board components can be shielded, the extra manufacturing steps and equipment associated with conventional devices for shielding printed circuit boards can be substantially eliminated, heat dissipation is increased over conventional devices for shielding printed circuit boards, and shielding can be implemented with standard printed circuit board manufacturing technology. In one embodiment a device includes a printed circuit board, and at least two electrical connectors proximate to the printed circuit board, with the at least two electrical connectors spaced to attenuate at least one prespecified frequency electromagnetic energy waveform. In another embodiment a data processing system includes at least one microprocessor mounted on at least one printed circuit board, and at least two electrical connectors proximate to the printed circuit board, with the at least two electrical connectors spaced to attenuate at least one prespecified frequency electromagnetic energy waveform. In yet another embodiment, a method of manufacturing includes deploying at least two electrical connectors proximate to a printed circuit board, said at least two electrical connectors spaced to attenuate at least one prespecified frequency electromagnetic energy waveform.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of this patent application will become apparent in the non-limiting detailed description set forth below.

BRIEF DESCRIPTION OF THE DRAWING

The use of the same reference symbols in different drawings indicates similar or identical items.

DETAILED DESCRIPTION

The division of the detailed description into separate sections is merely done as an aid to understanding and is in no way intended to be limiting.

I. Environment

Figure 1:
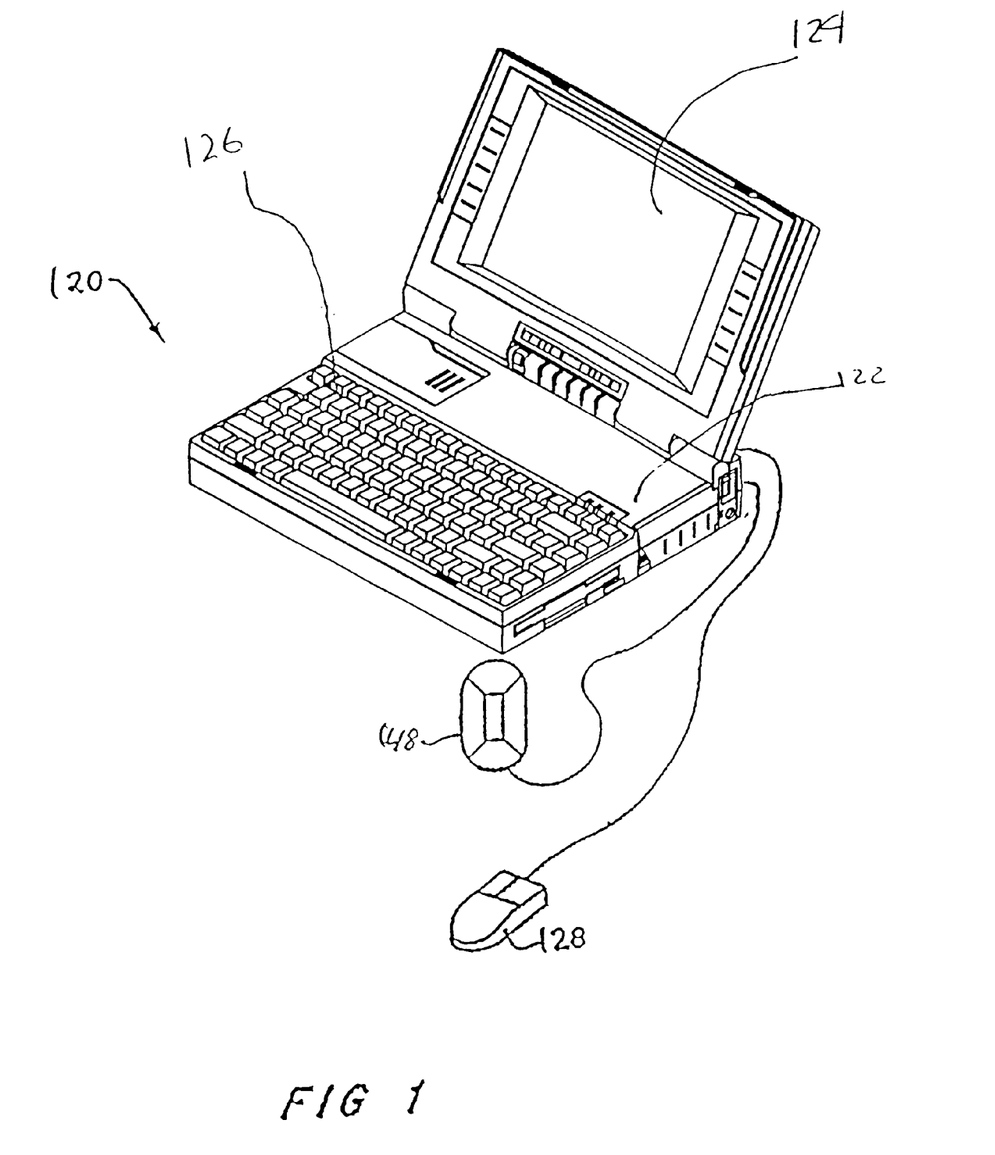
FIG. 1 depicts a pictorial representation of a data processing system which can be utilized in accordance with the method and system of an illustrative embodiment.

With reference now to the figures and in particular with reference now to FIG. 1, there is depicted a pictorial representation of a data processing system which can be utilized in accordance with the method and system of an illustrative embodiment. A graphical user interface system and method can be implemented with the data processing system depicted in FIG. 1. A data processing system 120 is depicted which includes a system unit 122, a video display device 124, a keyboard 126, a mouse 128, and a microphone 148. Data processing system 120 may be implemented utilizing any suitable computer such as an IBM-compatible or an Apple-compatible computer.

Figure 2:
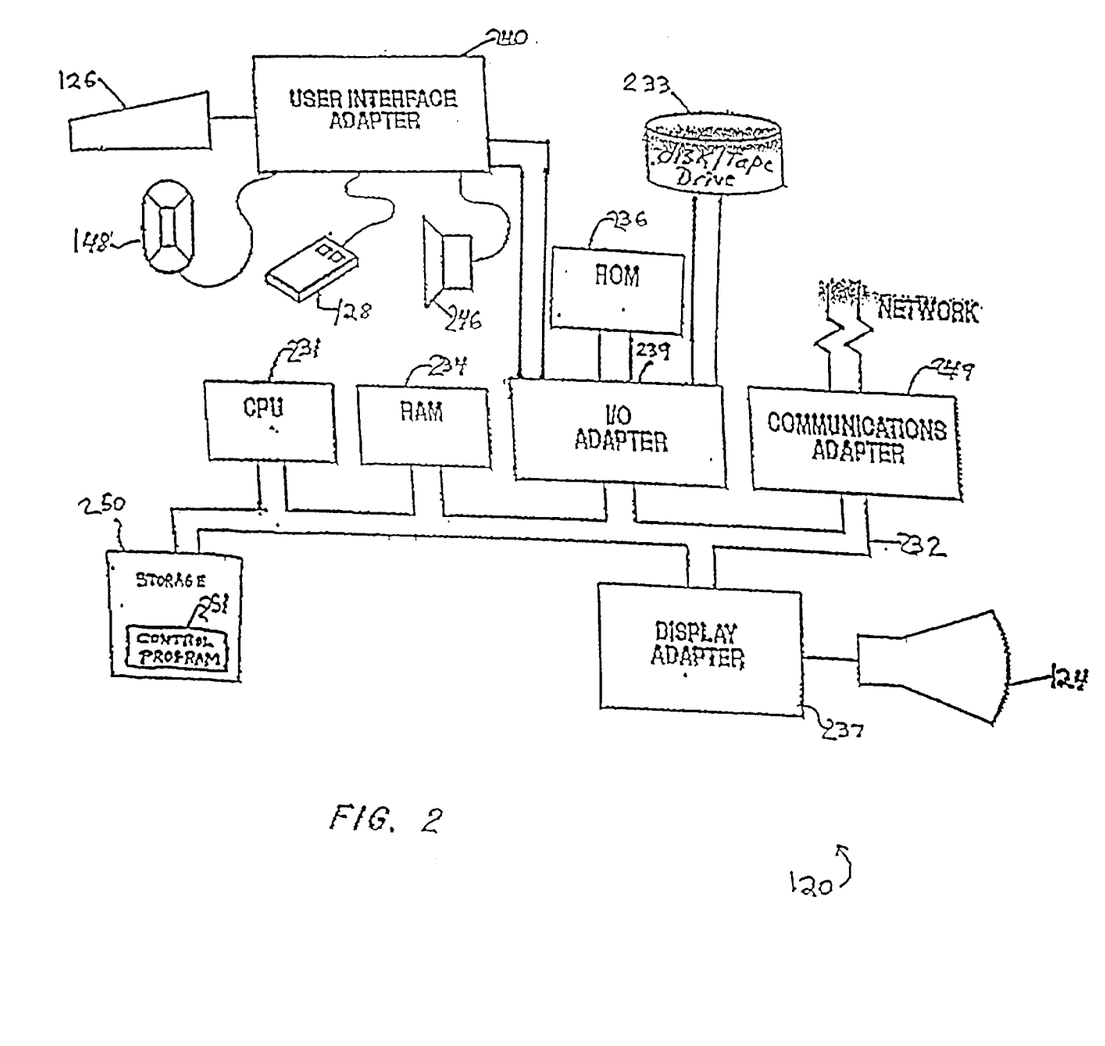
FIG. 2 illustrates a block diagram of a representative hardware environment, which incorporates a graphical user interface, which can be utilized in accordance with the method and system of an illustrative embodiment.

FIG. 2 is an illustration of a representative hardware environment, which incorporates a graphical user interface. FIG. 2 depicts selected components in data processing system 120 in which an illustrative embodiment may be implemented. Data processing system 120 includes Central Processing Unit ("CPU") 231, such as a conventional microprocessor, and a number of other units interconnected via system bus 232. System bus 232 is intended to be a generic representative of individual types of data buses used in data processing systems. Those skilled in the art will recognize that such buses vary dependent on design constraints and chipsets employed, but can include a processor bus (e.g., a bus that some chipsets use to send data to and from a processor), a cache bus (e.g., a dedicated bus which some processors use for accessing a system cache), a memory bus (e.g., a system bus that connects a memory subsystem to a chipset and a processor), a Local I/O Bus (e.g., a Peripheral Component Interconnect (PCI) bus), or a Standard I/O Bus (e.g., an Industry Standard Architecture (ISA) bus).

Data processing system 120 includes random-access memory ("RAM") 234, read-only memory ("ROM") 236, display adapter 237 for connecting system bus 232 to video display device 124, and I/O adapter 239 for connecting peripheral devices (e.g., disk and tape drives 233) to system bus 232. Video display device 124 is the visual output of data processing system 120, which can be a CRT-based video display well-known in the art of computer hardware. However, with a portable or notebook-based computer, video display device 124 can be an LCD-based, or a gas plasma-based, or any other type of flat-panel display. Data processing system 120 further includes user interface adapter 240 for connecting keyboard 126, mouse 128, speaker 246, microphone 148, and/or other user interface devices, such as a touch screen device (not shown), to system bus 232 through I/O adapter 239. Communications adapter 249 (e.g., an electrical or optical modem including supporting hardware and software) connects data processing system 120 to a data processing network.

Any suitable machine-readable media may retain the graphical user interface, such as RAM 234, ROM 236, a magnetic diskette, magnetic tape, or optical disk (the last three being located in disk and tape drives 233). Any suitable operating system such as one having an associated graphical user interface (e.g., Microsoft Windows) may direct CPU 231. Other technologies can also be utilized in conjunction with CPU 231, such as touch-screen technology or human voice control. In addition, data processing system 120 includes control program 251 which resides within computer storage 250. Control program 251 contains instructions that when executed on CPU 231 carries out application program (e.g., videoconferencing software) operations.

Those skilled in the art will appreciate that the hardware depicted in FIG. 2 may vary for specific applications. For example, other peripheral devices such as optical disk media, audio adapters, video cameras such as those used in videoconferencing, or programmable devices, such as PAL or EPROM programming devices well-known in the art of computer hardware, and the like may be utilized in addition to or in place of the hardware already depicted.

Those skilled in the art will recognize that data processing system 120 can be described in relation to data processing systems which perform essentially the same functions, irrespective of architectures. As an example of such, additional or alternative aspects of data processing system 120 are set forth in FIG. 3.

Figure 3:
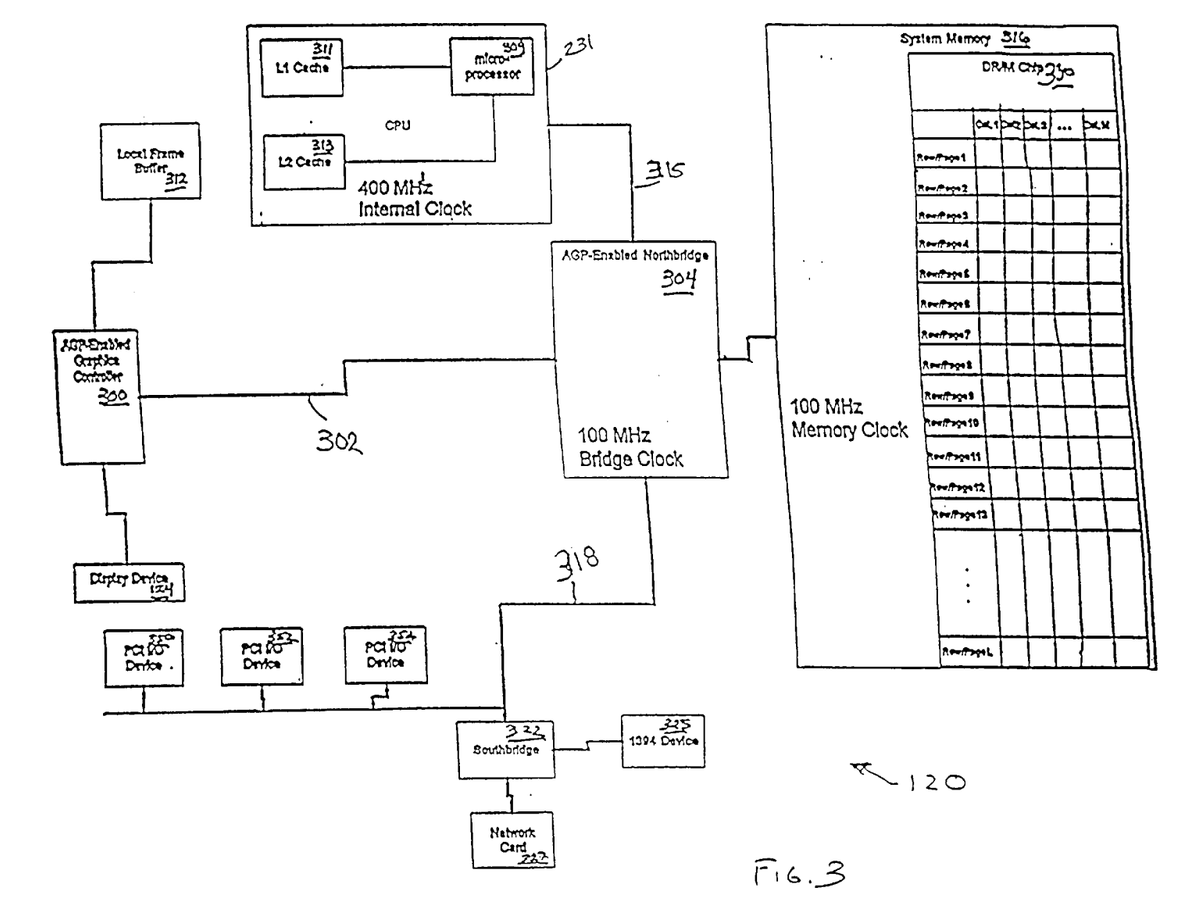
FIG. 3 shows a high-level component diagram depicting a data processing system which illustrates additional or alternative aspects of an environment wherein one or more embodiments may be practiced.

Referring now to FIG. 3, shown is a high-level component diagram depicting a partial data processing system 120 which illustrates additional or alternative aspects of an environment wherein one or more embodiments may be practiced. Shown are AGP-enabled graphics controller 300, AGP interconnect 302 (a data bus), and AGP-enabled Northbridge 304. Furthermore, deemed present is an AGP-enabled operating system. The term AGP-enabled is intended to mean that the so-referenced components are engineered such that they interface and function under the standards defined within the AGP interface specification (Intel Corporation, Accelerated Graphics Port Interface Specification). Further depicted are video display device 124, local frame buffer 312, Central Processing Unit (CPU) 231 (wherein are depicted microprocessor 309, L1 Cache 311, and L2 Cache 313), CPU bus 315, system memory 316, Peripheral Component Interconnect (PCI) bus 318, various PCI Input-Output (I/O) devices 350, 352, and 354, Southbridge 322, 1394 Device 325, and network card 327.

The foregoing components and devices are used herein as examples for sake of conceptual clarity. Thus, CPU 231 is utilized as an exemplar of any general processing unit, including but not limited to multiprocessor units; CPU bus 315 is utilized as an exemplar of any processing bus, including but not limited to multiprocessor buses; PCI devices 350–354 attached to PCI bus 318 are utilized as exemplars of any input-output devices attached to any I/O bus; AGP Interconnect 302 is utilized as an exemplar of any graphics bus; AGP-enabled graphics controller 300 is utilized as an exemplar of any graphics controller; Northbridge 304 and Southbridge 322 are utilized as exemplars of any type of bridge; 1394 device 325 is utilized as an exemplar of any type of isochronous source; and network card 327, even though the term "network" is used, is intended to serve as an exemplar of any type of synchronous or asynchronous input-output card. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Generally, each bus utilizes an independent set of protocols (or rules) to conduct data (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 304, Southbridge 322, and other bridges shown in that it is to be understood that such can translate and coordinate between various data buses and/or devices which communicate through the bridges.

II. Fence

Figure 4:
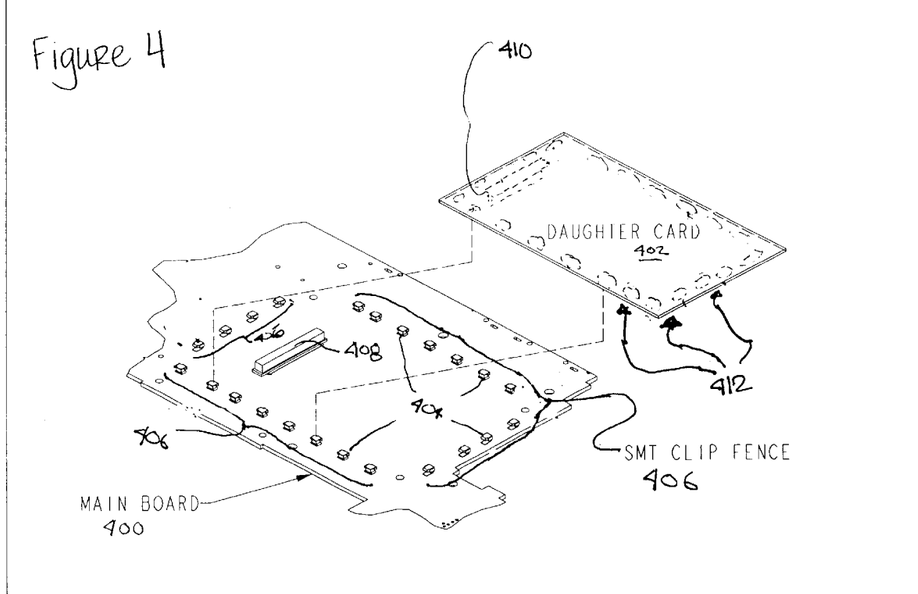
FIG. 4 depicts a perspective view of motherboard 400 (which is typically a printed circuit board) and daughterboard 402 (which is typically a printed circuit board).

With reference now to FIG. 4, shown is a perspective view of motherboard, or main board, 400 (which is typically a printed circuit board) and daughterboard, or daughter card, 402 (which is typically a printed circuit board). Depicted on motherboard 400 are connector 408 (which may be any one of many types of connectors well known in the art, such as an edge connector, or a pin connector) and a number of surface mount technology (SMT) spring fingers 404, which form SMT spring finger fence 406. (Although each SMT spring finger clip fence 406 is shown having only one or two straight segments, it is to be understood that such are merely illustrative and that as used herein SMT spring finger clip fence 406 can be composed of multiple segments of almost any shape (e.g., circular, rectangular, triangular, etc.). For example, the rectangular-like structure which somewhat encompasses the periphery of motherboard 400 could itself be viewed as an exemplar of SMT spring finger fence 406.) In one embodiment, two or more SMT spring fingers 404 forming SMT spring finger fence 406 are spaced at ½ inch intervals, such spacing having been found empirically to greatly reduce, or attenuate, the transmission of electromagnetic energy waveforms, up to 1 Giga-hertz in frequency, through SMT spring finger fence 406. Thus, with the described spacing, SMT spring finger fence 406 effectively forms a "virtual" can, or fence, in that it effectively blocks electromagnetic energy, up to 1 Giga-hertz in frequency, from passing through SMT spring finger fence 406. It will be appreciated that other spacings will attenuate other frequency waveforms, and that the spacings need not necessarily be uniform. As a rule of thumb, the spacing between SMT spring fingers 404 forming SMT spring finger fence 406 can be obtained by use of the following equation:

$$S = \frac{1}{20} \times \lambda$$

where $\lambda$ equals the wave length, in meters, of the upper frequency to be attenuated. The valve of $\lambda$ can be obtained using the equation $\lambda = c/f$, where c is $300 \times 10^6$ meters/second (approximately the speed of light in air), and f is the uppermost frequency, in hertz, to be attenuated. That is, the foregoing equation will provide the spacing necessary to substantially ensure that electromagnetic energy waveforms at or below frequency f are substantially attenuated.

Daughterboard 402 has on its underside mating connector 410 which is formed to mate with connector 408 and SMT solder pads 412 which are arranged on the underside of daughterboard 402 so that when mating connector 410 mates with connector 408 SMT solder pads 412 will appropriately interface with their respective SMT spring fingers 404 augmenting SMT spring finger fence 406. When mating connector 410 effectively mates (often achieved via a locking mechanism well known to those within the art) with connector 408, SMT spring finger fence 406 in conjunction with SMT solder pads 412 more effectively forms a fence to electromagnetic radiation, in that it greatly attenuates electromagnetic waveforms, with the frequencies attenuated being related to the spacing of SMT spring fingers 404 in each SMT spring finger fence 406 as discussed above.

Figure 5:
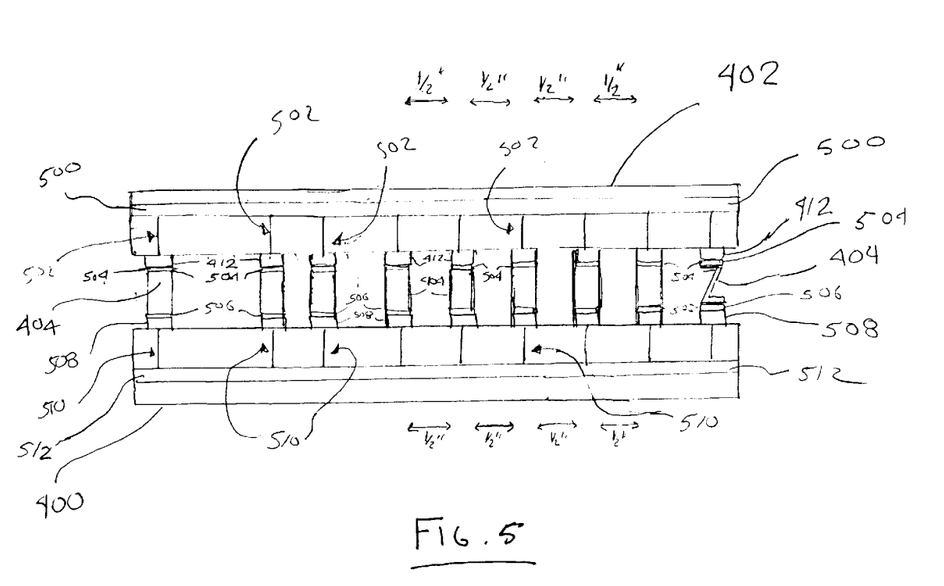
FIG. 5 illustrates a plan view along the length of daughterboard 402 and motherboard 400 when connector 408 and mating connector 410 are fully engaged.

Referring now to FIG. 5, shown is a plan view along the length of daughterboard 402 and motherboard 400 when connector 408 and mating connector 410 are fully engaged. Depicted within daughterboard 402 is ground plane 500 (typically made from a conducting material such as aluminum or copper) electrically coupled to conducting vias 502 (typically made from a conducting material such as aluminum or copper). Illustrated is that each conducting via 502 electrically connects with SMT solder pad 412 (typically made from a conducting material such as aluminum or copper). Shown is that each SMT solder pad 412 affixed to daughterboard 402, by and through layer of solder 504, electrically connects with a respective SMT spring finger 404. Depicted is that five of depicted SMT solder pads 412 are spaced ½ inch apart such that each of the SMT spring fingers 404 respectively associated with the five of depicted SMT solder pads 404 are spaced ½ inch apart, such spacing having been found empirically to provide attenuation of electromagnetic waveforms of frequency 1 Giga-hertz and below.

Depicted is that each SMT spring finger 404, by and through layer of solder 506, electrically connects with a respective SMT solder pad 508 affixed to motherboard 400. Illustrated is that each SMT solder pad 508 is electrically connected with a respective one of conducting vias 510. Depicted is that conducting vias 510 are respectively connected with ground plane 512 within motherboard 400. Depicted is that five of depicted SMT solder pads 508 are spaced ½ inch apart such that each of the SMT spring fingers 404 respectively associated with the five of depicted SMT solder pads 508 are spaced ½ inch apart, such spacing having been found empirically to provide attenuation of electromagnetic waveforms of frequency 1 Giga-hertz and below.

The foregoing described SMT spring fingers 404 deployed around periphery of daughterboard 402, but alternate schemes are possible. For example, a virtual fence could be built around individual components deployed on daughterboard 402 or, alternatively, individual components deployed on motherboard 400. As another example, connector 408 and/or mating connector 410 could either or both form part of a composite virtual fence having the rest of the composite virtual fence formed from SMT spring finger fences 406.

Figure 6:
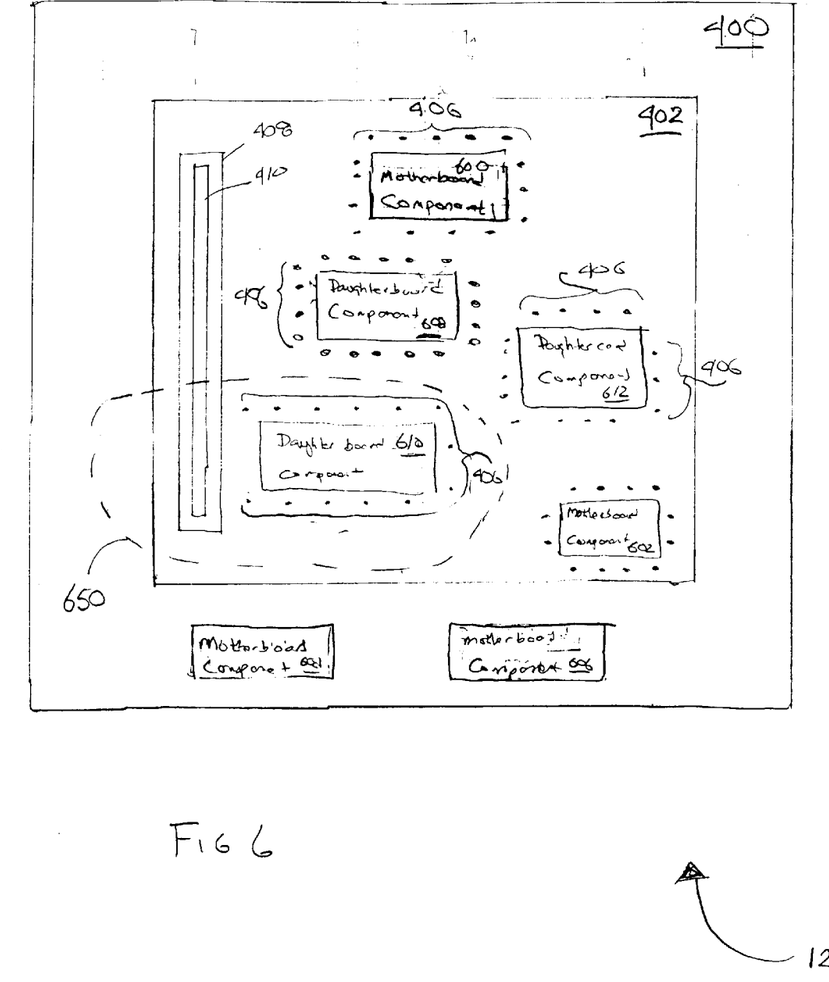
FIG. 6 depicts a top plan view of daughterboard 402 mated with motherboard 400.

With reference now to FIG. 6, depicted is a top plan view of daughterboard 402 mated with motherboard 400 which are utilized to implement a part of data processing system 120. Illustrated is that motherboard 400 has motherboard components 600–606 at various locations, where motherboard components 600–606 are intended to be representative of any data processing system components which can be deployed on a motherboard (e.g., components such as those described in FIGS. 2 and 3) interconnected by any bus or buses chosen by the board and/or system designer. Shown is that daughterboard 402 has daughterboard components 608–612 at various locations, where daughterboard components 608–612 are intended to be representative of any data processing system components which can be deployed on a daughterboard (e.g., components such as those described in FIGS. 2 and 3, or components such as those described in Intel's *Mobile Audio/Modem Daughterboard Specification*, Revision 1.0 (Feb. 22, 1999), hereby incorporated by reference in its entirety, such as codecs, amplifiers, or other devices described therein) interconnected by any bus or buses chosen by the board and/or system designer.

Illustrated is that SMT spring finger fences 406, as such have been previously discussed, are deployed around individual daughterboard components 608 and 612. Shown is that an SMT-connector hybrid fence 650, composed of a 3-sided SMT finger fence 406 connector 408 mated with mating connector 410. Further depicted is that SMT spring finger fences 406, as such have been previously discussed, are deployed around individual motherboard components 600–602 resident on motherboard 400 at a location substantially underneath daughterboard 402.

Notice that manufacturing a device in accord with the foregoing description requires little more than that extra vias be drilled and extra SMT solder pads, spring fingers, and solder be used to orient the foregoing-referenced vias, pads, and spring fingers such that electromagnetic radiation of a desired frequency be attenuated. Accordingly, the foregoing described device and its associated process of manufacturing will require no more additional equipment above and beyond that normally required to fabricate printed circuit boards in the absence of electromagnetic shielding. Notice also that the fact that the spring finger fences have spacing, which gives a heat dissipation advantage over the conventional can or fence in that air movement through any fence or fences employed is relatively unimpaired.

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments have been shown and described, it will be obvious to those skilled in the art that, based upon the teachings herein, changes and modifications may be made without departing from the appended claims and their broader aspects and, therefore, the appended claims are to encompass within their scope all such changes and modifications as are within the true spirit and scope of the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to containing only one such element, even when same claim includes the introductory phrases "one or more" or "at least one" and indefinite articles such as "a" or "an"; the same holds true for the use of definite articles used to introduce claim elements.

What is claimed is:

1. A device comprising:
    a printed circuit board; and
    at least two electrical connectors proximate to said printed circuit board, said at least two electrical connectors spaced to attenuate at least one prespecified frequency electromagnetic energy waveform.

2. The device according to claim 1, wherein said printed circuit board comprises:
    a daughterboard.

3. The device according to claim 2, wherein said daughterboard comprises:
    a ground plane integral with said daughterboard.

4. The device according to claim 1, wherein said printed circuit board comprises:
    a motherboard.

5. The device according to claim 4, wherein said motherboard comprises:
    a ground plane integral with said motherboard.

6. The device of claim 1, wherein said at least two electrical connectors spaced to attenuate at least one prespecified frequency electromagnetic energy waveform comprise:
    at least one surface mount technology spring finger.

7. The device of claim 1, wherein said at least two electrical connectors spaced to attenuate at least one pre specified frequency electromagnetic energy waveform comprise:
    at least one surface mount technology solder pad.

8. The device of claim 1, wherein said at least two electrical connectors spaced to attenuate at least one prespecified frequency electromagnetic energy waveform comprise:
    at least one via.

9. The device of claim 1, wherein said at least two electrical connectors spaced to attenuate at least one prespecified frequency electromagnetic energy waveform comprise:
    said at least two electrical connectors spaced about a periphery of said printed circuit board.

10. The device of claim 1, wherein said at least two electrical connectors spaced to attenuate at least one prespecified frequency electromagnetic energy waveform comprise:
    said at least two electrical connectors spaced about a periphery of a data processing system component proximate to said printed circuit board.

11. The device of claim 1, wherein said at least two electrical connectors spaced to attenuate at least one prespecified frequency electromagnetic energy waveform comprise:
    said at least two electrical connectors spaced to attenuate a 1 Giga-hertz electromagnetic energy waveform.

12. The device of claim 11, wherein said at least two electrical connectors spaced to attenuate a 1 Giga-hertz electromagnetic energy waveform comprise:
    said at least two electrical connectors spaced substantially one-half (½) inch apart.

13. A computer system comprising:
    at least one microprocessor mounted on a printed circuit board; and
    at least two electrical connectors proximate to the printed circuit board, said at least two electrical connectors spaced to attenuate at least one prespecified frequency electromagnetic energy waveform.

14. The computer system according to claim 13, wherein the printed circuit board comprises:
    a daughterboard.

15. The computer system according to claim 14, wherein said daughterboard comprises:
    a ground plane integral with said daughterboard.

16. The computer system according to claim 13, wherein the printed circuit board comprises:
    a motherboard.

17. The computer system according to claim 16, wherein said motherboard comprises:
    a ground plane integral with said motherboard.

18. The computer system of claim 13, wherein said at least two electrical connectors spaced to attenuate at least one prespecified frequency electromagnetic energy waveform comprise:
    at least one surface mount technology spring finger.

19. The computer system of claim 13, wherein said at least two electrical connectors spaced to attenuate at least one prespecified frequency electromagnetic energy waveform comprise:
    at least one surface mount technology solder pad.

20. The computer system of claim 13, wherein said at least two electrical connectors spaced to attenuate at least one prespecified frequency electromagnetic energy waveform comprise:
    said at least two electrical connectors spaced about a periphery of the printed circuit board.

21. The computer system of claim 13, wherein said at least two electrical connectors spaced to attenuate at least one prespecified frequency electromagnetic energy waveform comprise:
  said at least two electrical connectors spaced about a periphery of a data processing system component proximate to the printed circuit board.

22. The computer system of claim 13, wherein said at least two electrical connectors spaced to attenuate at least one prespecified frequency electromagnetic energy waveform comprise:
  at least one via.

23. The computer system of claim 13, wherein said at least two electrical connectors spaced to attenuate at least one prespecified frequency electromagnetic energy waveform comprise:
  said at least two electrical connectors spaced to attenuate a 1 Giga-hertz electromagnetic energy waveform.

24. The computer system of claim 23, wherein said at least two electrical connectors spaced to attenuate a 1 Giga-hertz electromagnetic energy waveform comprises:
  said at least two electrical connectors spaced substantially one-half (½) inch apart.

25. The computer system of claim 13, further comprising:
  a codec mounted on the printed circuit board.

26. The computer system of claim 13, further comprising:
  a memory mounted on the printed circuit board.

27. The computer system of claim 13, further comprising:
  a data bus integral with the printed circuit board.

28. A method of manufacture comprising:
  deploying at least two electrical connectors proximate to a printed circuit board, said at least two electrical connectors spaced to attenuate at least one prespecified frequency electromagnetic energy waveform.

29. The method according to claim 28, wherein the printed circuit board comprises:
  a daughterboard.

30. The method according to claim 29, wherein said daughterboard comprises:
  a ground plane integral with said daughterboard.

31. The method according to claim 28, wherein the printed circuit board comprises:
  a motherboard.

32. The method according to claim 31, wherein said motherboard comprises:
  a ground plane integral with said motherboard.

33. The method of claim 28, wherein said deploying at least two electrical connectors proximate to the printed circuit board, said at least two electrical connectors spaced to attenuate at least one prespecified frequency electromagnetic energy waveform comprise:
  soldering at least one surface mount technology spring finger to a solder pad.

34. The method of claim 28, wherein said deploying at least two electrical connectors proximate to the printed circuit board, said at least two electrical connectors spaced to attenuate at least one prespecified frequency electromagnetic energy waveform comprise:
  connecting a via between at least one surface mount technology solder pad and a ground plane of the printed circuit board.

35. The method of claim 28, wherein said deploying at least two electrical connectors proximate to the printed circuit board, said at least two electrical connectors spaced to attenuate at least one prespecified frequency electromagnetic energy waveform comprise:
  deploying at least two electrical connectors spaced about a periphery of the printed circuit board.

36. The method of claim 28, wherein said deploying at least two electrical connectors proximate to the printed circuit board, said at least two electrical connectors spaced to attenuate at least one prespecified frequency electromagnetic energy waveform comprise:
  deploying at least two electrical connectors spaced about a periphery of a data processing system component proximate to the printed circuit board.

37. The method of claim 28, wherein said deploying at least two electrical connectors proximate to the printed circuit board, said at least two electrical connectors spaced to attenuate at least one prespecified frequency electromagnetic energy waveform comprise:
  spacing at least two electrical connectors a distance sufficient to attenuate a 1 Giga-hertz electromagnetic energy waveform.

38. The method of claim 37, wherein said spacing at least two electrical connectors a distance sufficient to attenuate a 1 Giga-hertz electromagnetic energy waveform comprises:
  spacing the at least two electrical connectors substantially one-half (½) inch apart.

39. A device comprising:
  a printed circuit board; and
  at least two electrical connectors proximate to said printed circuit board, said at least two electrical connectors providing a virtual fence against at least one prespecified frequency electromagnetic energy waveform.

40. The device according to claim 39, wherein said at least two electrical connectors providing a virtual fence against at least one prespecified frequency electromagnetic energy waveform further comprises:
  a first electrical connector and a second electrical connector spaced a distance apart, the distance apart substantially a function of the prespecified frequency electromagnetic waveform.

41. The device according to claim 40, wherein the distance apart substantially a function of the prespecified frequency electromagnetic waveform comprises:
  a spacing, S, substantially defined by an equation of the form $$S = \frac{1}{20} \times \lambda,$$

where λ equals a wave length, in meters, of a frequency to be attenuated.

42. The device according to claim 39, wherein said printed circuit board comprises:
  a daughterboard.

43. The device according to claim 42, wherein said daughterboard comprises:
  a ground plane integral with said daughterboard.

44. The device according to claim 39, wherein said printed circuit board comprises:
  a motherboard.

45. The device according to claim 44, wherein said motherboard comprises:
  a ground plane integral with said motherboard.

46. The device of claim 39, wherein said at least two electrical connectors providing a virtual fence against at least one prespecified frequency electromagnetic energy waveform comprise:
  at least one surface mount technology spring finger.

47. The device of claim 39, wherein said at least two electrical connectors providing a virtual fence against at least one prespecified frequency electromagnetic energy waveform comprise:

at least one surface mount technology solder pad.

48. The device of claim 39, wherein said at least two electrical connectors providing a virtual fence against at least one prespecified frequency electromagnetic energy waveform comprise:

at least one via.

49. The device of claim 39, wherein said at least two electrical connectors providing a virtual fence against at least one prespecified frequency electromagnetic energy waveform comprise:

said at least two electrical connectors spaced about a periphery of said printed circuit board.

50. The device of claim 39, wherein said at least two electrical connectors providing a virtual fence against at least one prespecified frequency electromagnetic energy waveform comprise:

said at least two electrical connectors spaced about a periphery of a data processing system component proximate to said printed circuit board.

51. The device of claim 39, wherein said at least two electrical connectors providing a virtual fence against at least one prespecified frequency electromagnetic energy waveform comprise:

said at least two electrical connectors spaced to attenuate a 1 Giga-hertz electromagnetic energy waveform.

52. The device of claim 51, wherein said at least two electrical connectors spaced to attenuate a 1 Giga-hertz electromagnetic energy waveform comprise:

said at least two electrical connectors spaced substantially one-half (½) inch apart.

53. A computer system comprising:

at least one microprocessor mounted on a printed circuit board; and at least two electrical connectors proximate to said printed circuit board, said at least two electrical connectors providing a virtual fence against at least one prespecified frequency electromagnetic energy waveform.

54. The computer system according to claim 53, wherein said at least two electrical connectors providing a virtual fence against at least one prespecified frequency electromagnetic energy waveform further comprises:

a first electrical connector and a second electrical connector spaced a distance apart, the distance apart substantially a function of the prespecified frequency electromagnetic waveform.

55. The computer system according to claim 54, wherein the distance apart substantially a function of the prespecified frequency electromagnetic waveform comprises:

a spacing, S, substantially defined by an equation of the form $$S = \frac{1}{20} \times \lambda,$$

where λ equals a wave length, in meters, of a frequency to be attenuated.

56. The computer system according to claim 53, wherein said printed circuit board comprises:

a daughterboard.

57. The computer system according to claim 56, wherein said daughterboard comprises:

a ground plane integral with said daughterboard.

58. The computer system according to claim 53, wherein said printed circuit board comprises:

a motherboard.

59. The computer system according to claim 58, wherein said motherboard comprises:

a ground plane integral with said motherboard.

60. The computer system of claim 53, wherein said at least two electrical connectors providing a virtual fence against at least one prespecified frequency electromagnetic energy waveform comprise:

at least one surface mount technology spring finger.

61. The computer system of claim 53, wherein said at least two electrical connectors providing a virtual fence against at least one prespecified frequency electromagnetic energy waveform comprise:

at least one surface mount technology solder pad.

62. The computer system of claim 53, wherein said at least two electrical connectors providing a virtual fence against at least one prespecified frequency electromagnetic energy waveform comprise:

at least one via.

63. The computer system of claim 53, wherein said at least two electrical connectors providing a virtual fence against at least one prespecified frequency electromagnetic energy waveform comprise:

said at least two electrical connectors spaced about a periphery of said printed circuit board.

64. The computer system of claim 53, wherein said at least two electrical connectors providing a virtual fence against at least one prespecified frequency electromagnetic energy waveform comprise:

said at least two electrical connectors spaced about a periphery of a data processing system component proximate to said printed circuit board.

65. The computer system of claim 53, wherein said at least two electrical connectors providing a virtual fence against at least one prespecified frequency electromagnetic energy waveform comprise:

said at least two electrical connectors spaced to attenuate a 1 Giga-hertz electromagnetic energy waveform.

66. The computer system of claim 65, wherein said at least two electrical connectors spaced to attenuate a 1 Giga-hertz electromagnetic energy waveform comprise:

said at least two electrical connectors spaced substantially one-half (½) inch apart.

67. The computer system of claim 53, further comprising: a codec mounted on the printed circuit board.

68. The computer system of claim 53, further comprising: a memory mounted on the printed circuit board.

69. The computer system of claim 53, further comprising: a data bus integral with the printed circuit board.

70. A method of manufacture comprising:

deploying at least two electrical connectors proximate to a printed circuit board, said at least two electrical connectors providing a virtual fence against at least one prespecified frequency electromagnetic energy waveform.

71. The method according to claim 70, wherein said at least two electrical connectors providing a virtual fence against at least one prespecified frequency electromagnetic energy waveform further comprise:

a first electrical connector and a second electrical connector spaced a distance apart, the distance apart substantially a function of the prespecified frequency electromagnetic waveform.

72. The method according to claim 71, wherein the distance apart substantially a function of the prespecified frequency electromagnetic waveform comprises:

a spacing, S, substantially defined by an equation of the form $$S = \frac{1}{20} \times \lambda,$$

where λ equals a wave length, in meters, of a frequency to be attenuated.

73. The method according to claim 70, wherein the printed circuit board comprises:

a daughterboard.

74. The method according to claim 73, wherein said daughterboard comprises:

a ground plane integral with said daughterboard.

75. The method according to claim 70, wherein the printed circuit board comprises:

a motherboard.

76. The method according to claim 75, wherein said motherboard comprises:

a ground plane integral with said motherboard.

77. The method of claim 70, wherein said deploying at least two electrical connectors proximate to a printed circuit board, said at least two electrical connectors providing a virtual fence against at least one prespecified frequency electromagnetic energy waveform comprise:

soldering at least one surface mount technology spring finger to a solder pad.

78. The method of claim 70, wherein said deploying at least two electrical connectors proximate to a printed circuit board, said at least two electrical connectors providing a virtual fence against at least one prespecified frequency electromagnetic energy waveform comprise:

connecting a via between at least one surface mount technology solder pad and a ground plane of the printed circuit board.

79. The method of claim 70, wherein said deploying at least two electrical connectors proximate to a printed circuit board, said at least two electrical connectors providing a virtual fence against at least one prespecified frequency electromagnetic energy waveform comprise:

deploying at least two electrical connectors spaced about a periphery of the printed circuit board.

80. The method of claim 70, wherein said deploying at least two electrical connectors proximate to a printed circuit board, said at least two electrical connectors providing a virtual fence against at least one prespecified frequency electromagnetic energy waveform comprise:

deploying at least two electrical connectors spaced about a periphery of a data processing system component proximate to the printed circuit board.

81. The method of claim 70, wherein said deploying at least two electrical connectors proximate to a printed circuit board, said at least two electrical connectors providing a virtual fence against at least one prespecified frequency electromagnetic energy waveform comprise:

spacing at least two electrical connectors a distance sufficient to attenuate a 1 Giga-hertz electromagnetic energy waveform.

82. The method of claim 81 wherein said spacing at least two electrical connectors a distance sufficient to attenuate a 1 Giga-hertz electromagnetic energy waveform comprises:

spacing the at least two electrical connectors substantially one-half (½) inch apart.

* * * * *